Dec. 12, 1967 R. A. NAGY ET AL 3,357,099
PROVIDING PLATED THROUGH-HOLE CONNECTIONS WITH THE PLATING
RESIST EXTENDING TO THE HOLE EDGES
Filed Oct. 29, 1962 2 Sheets-Sheet 1

INVENTORS
RICHARD A. NAGY
JOE C. MERICLE
BY
ATTORNEY

INVENTORS
RICHARD A. NAGY
JOE C. MERICLE
BY L. Lee Humphries
ATTORNEY

United States Patent Office 3,357,099
Patented Dec. 12, 1967

3,357,099

PROVIDING PLATED THROUGH-HOLE CONNECTIONS WITH THE PLATING RESIST EXTENDING TO THE HOLE EDGES

Richard A. Nagy, Fullerton, and Joe C. Mericle, Los Angeles, Calif., assignors to North American Aviation, Inc.

Filed Oct. 29, 1962, Ser. No. 233,686
5 Claims. (Cl. 29—625)

ABSTRACT OF THE DISCLOSURE

A process for providing terminal areas on the surfaces of a printed circuit board concentric with holes drilled therethrough. The process comprises the steps of; defining on the board a pattern of conductive lines but not defining terminal areas surrounding the edges of the holes; chemically depositing a layer of conductive material on the interior surface of the drilled holes; and electroplating using a low throwing power solution to form a metal coating inside the holes, on the conductive lines, and around the edges of the drilled holes. The plating around the hole edges forms a concentric terminal insuring good electrical contact between the defined line and the through-plating in the hole. Finally, another metal layer is plated on the board, and excess resist and unplated metal clading is removed by etching.

Figure 1:
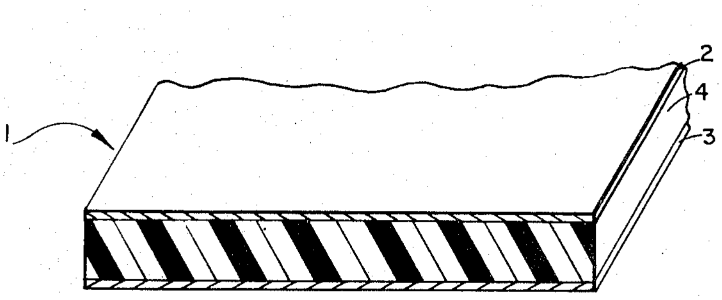

This invention relates to a process for forming a conductor around printed circuit board holes and more specifically concerns a process for forming a conductor concentrically around a hole.

Present circuit board manufacturing processes, particularly the process for forming terminal areas around drilled holes, effect the electrodeposition of a conductive metal onto an exposed copper plated pattern. The pattern is previously laid out or defined over pre-drilled holes in the board by masking techniques. However, due to variations and wear, both in the drills and the drill jigs used to produce the hole pattern in the board, and due to tolerances introduced in forming the circuit pattern on the board, hole locations are often misaligned with respect to the terminal area pattern. Terminal areas defined by the misaligned patterns are also misaligned such that the hole may be located anywhere inside the terminal area pattern or partially outside. Variations usually are not great enough to cause a complete misalignment. The variations beyond predetermined tolerances, if not eliminated or compensated for, contribute to poor electrical contact between a component soldered in the hole and some other point on a circuit board. The bonding area around one diameter of the hole is reduced. The solder used to affix a component to the board has a diminished area to which it may attach and hold the component in the hole. As a result, components sometimes become loose and fall off the circuit board or make intermittent electrical contact with the circuits on the board.

A combination of techniques are now employed to eliminate these shortcomings, for example, personnel inspect the board after a pattern has been formed to see if misalignment has occurred. If the hole is too far off center from the pattern, a portion of the maskant used in printing or forming the circuit pattern is scraped away using hand tools. Also, closer tolerance drills and drill jigs are utilized in reducing errors, and greater care is taken in masking circuit patterns on the board. Terminal areas are often made larger so that if misalignment does occur there will still be sufficient area to permit good bonding of the soldered component to the circuit. These techniques obviously are uneconomical, often unreliable and particularly with respect to using larger patterns, hinder microminiaturization. Since greater area is used for the pattern, greater area must be used for the circuit, hence larger circuit boards instead of the more desired smaller compact boards result.

This inventive process overcomes the deficiencies existing in the prior art by forming a terminal area concentric with a pre-drilled hole. Holes are drilled as aforementioned with drills and drill jigs and patterns are formed on the boards outer surfaces. However, terminal areas are omitted from the pattern. The pattern is concerned only with conductor lines from one hole to another. Stated another way, the circuit pattern defines the circuit lines to be plated but does not define the terminal areas or conductive regions to be plated on the surfaces of the board surrounding the edges of the holes. A conducting layer of metal is deposited by chemical reduction along the inner diameters of the drilled holes. The pattern and holes are electroplated with a conducting metal such as copper, nickel, tin alloy, etc., on the exposed surface as well as around the hole diameters and inner circumferences. Concentric hole electroplating as well as electroplating on the exposed copper pattern, is achieved in the prior step by use of a low throwing power solution. As a result even though a pattern line is misaligned with respect to the hole, the terminal area is concentric with the hole and is formed with sufficient area for good physical and electrical bonding. Misalignment of holes with a conductor line is never great enough to cause a complete by-pass of a pre-drilled hole by a pattern line or conductor. The electroplated areas are plated with another conducting metal such as gold. After the final plating step, the areas not covered by the final plating are removed and the circuit board is ready for use.

It is, therefore, an object of this invention to provide a process for centering terminal areas with respect to pre-drilled holes on the surfaces of a circuit board.

It is an object of this invention to provide a process for centering terminal areas on either surface of the board having holes located therein.

It is still another object of this invention to eliminate misregistration of screened circuit patterns with holes.

It is still a further object of this invention to minimize touch-up operations required to achieve better centering of the hole with the screened circuit pattern.

A still further object of this invention is to produce an annular conductor that is substantially concentric wth the hole.

Another object of this invention is to produce a more compact circuit board design using concentric annular conductor rings around holes.

It is still a further object of this invention to form a terminal area and pad around holes in a printed circuit board simultaneously with the metal film that is plated on the hole walls.

Figure 2:
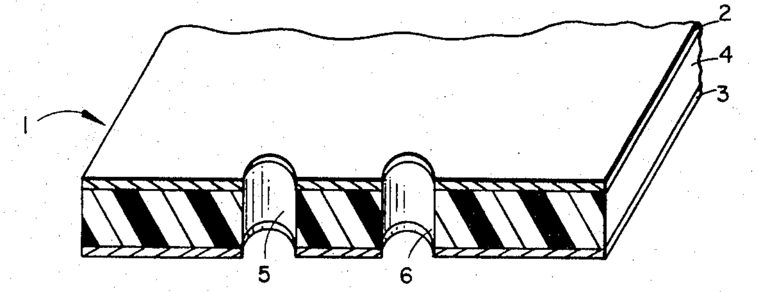
Figure 3:
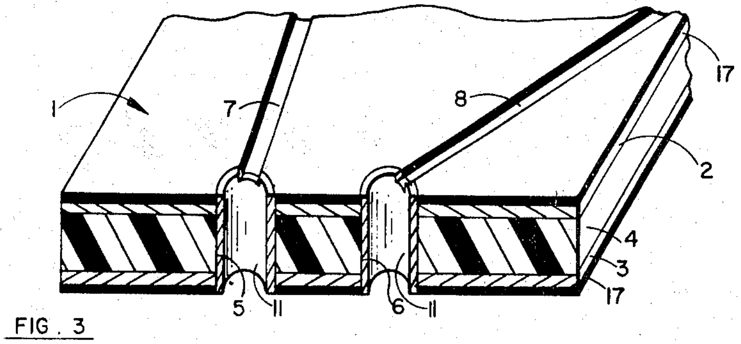
Figure 4:
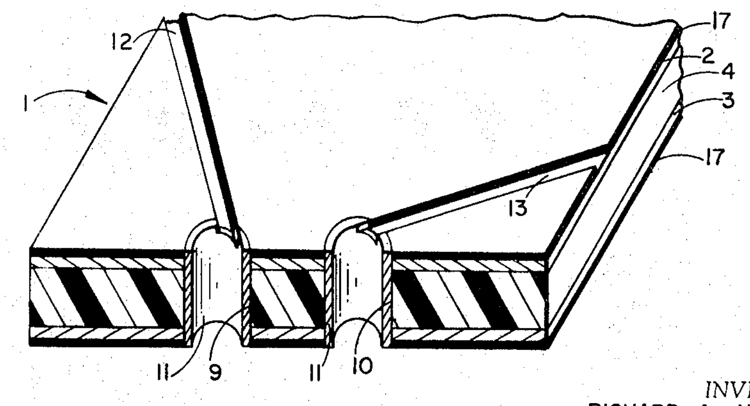

These and other objects of the invention will become apparent from the following description taken in connection with the accompanying drawings, of which FIGS. 1, 2, 3, 5, 6, and 7 illustrate a series of steps comprising a process for forming printed circuits on circuit boards including the forming of terminal areas concentric with pre-drilled holes; and FIG. 4 illustrates a conductor line pattern which is misaligned with respect to pre-drilled holes.

A copper clad laminate or board 1 is first drilled to obtain a desired hole pattern and then screen stenciled with a circuit pattern. Copper foil layers 2 and 3 cover a dielectric material 4. A portion of a conductor line pattern formed on board 1 is illustrated in FIG. 3. It should be noted that for most applications, a pattern is also printed on the bottom surfaces of a board, however, discussion herein is limited to a pattern formed on the top layer since that appears sufficient to describe the process of this invention. The pattern is printed on the circuit board either before or after the holes are drilled. An example of a drilled hole pattern is shown in FIG. 2 for holes 5 and 6. It should be obvious to those skilled in the art that many techniques in addition to screen stenciling may be employed to print circuit patterns on boards. Screen stenciling is given by way of illustration only and is not intended to be a limitation on the process described herein. The circuit pattern illustrated by FIG. 3 is different from the patterns used in the prior art in that all terminal areas have been eliminated from the pattern. The pattern contains only conductor lines 7 and 8. Holes 5 and 6 are also shown. An example of misalignment, which is compensated for by the process disclosed herein, may be seen by referring to FIG. 4. If the terminal pad areas for lines 12 and 13 around the holes 9 and 10 had not been omitted from the circuit pattern, the holes would not be concentric with the pattern areas and after plating, the holes would not be concentric with the plated terminal areas, thereby giving rise to the deficiency in bonding area discussed earlier. As will be indicated in connection with the steps of this process, deficiencies in bonding areas are overcome. After the pattern has been formed on the surface of the board, for example by printing on maskant layer 17, a metal film such as copper is then chemically deposited inside the holes. The metal so deposited renders the dielectric layer comprised of material of which is plastic, glass, etc., electrically conductive and connects foil cladding layers 2 and 3 together, thus permitting subsequent electrodepositions to be accomplished on a good conducting surface instead of the normally poor conducting surfaces of the dielectric layer 4. FIG. 3 illustrates the metal film layer 11 deposited inside holes 5 and 6. In the event electroless copper film is deposited on the surfaces of the board 1, it is removed by sanding scraping or other appropriate means because as compared with the foil layers 2 and 3, the film offers less adhesion to later plating than does the foil layers 2 and 3. Board 1 is electrolytically plated with a desired conducting metal, such as copper, nickel, tin alloy, etc., to form a continuous deposit on all exposed foil surfaces and hole walls. For the example under discussion, metal would be deposited inside holes 5 and 6 and along the surfaces of the lamination or board 1 defined by the circuit pattern shown in FIG. 3 as conductor lines 7 and 8. The plating solution used for electrodeposition is one with low throwing power characteristics. Low throwing power is defined for purposes of this application as the inability of a solution to electroplate uniformly on an irregularly shaped cathode as opposed to a regular shaped cathode. The conducting surfaces of board 1 excluding the hole edge portion constitute the regular shaped cathode and the edges of the holes 5 and 6 constitute the irregularly shaped portions of the cathode. Deposition from a low throwing power solution results in a non-uniform deposit on an irregularly shaped cathode. Deposition from a high throwing power solution results in a uniform deposit on an irregularly shaped cathode as well as on a regular shaped cathode.

Figure 5:
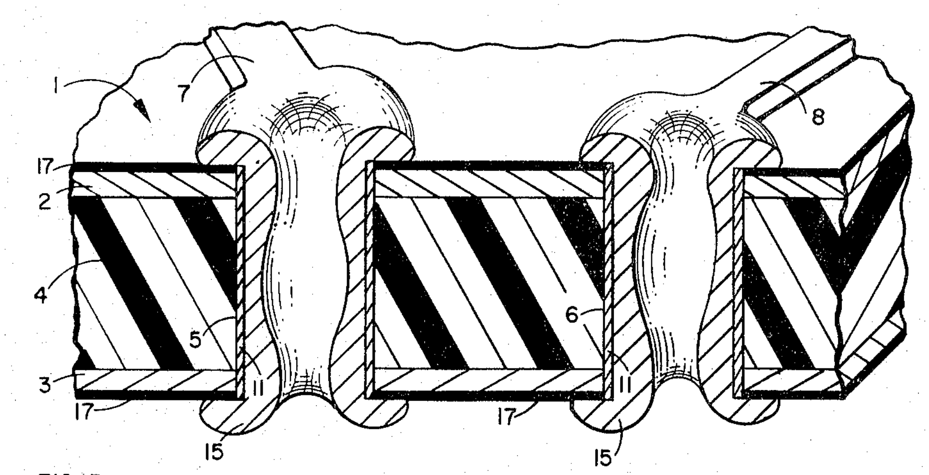

Inside the hole area, as illustrated by FIG. 5, the deposit is less than the deposit on the outer exposed surfaces. Also illustrated in FIG. 5 is the flange or mushrooming effect of depositing a metal on the exposed surfaces of board 1 by use of a low throwing power solution. The mushrooming effect produces a flange which gives the plated metal layer 15 additional mechanical strength; and the plating inside the holes 5 and 6 is gripped by the flange-like deposits of metal concentric with the holes. If misalignment had been present as illustrated in FIG. 4, then the terminal areas would have still been concentric with the hole and the bonding area to effect a complete affixation of a component to the board and would be equal to a bonding area where the pattern and the holes were completely aligned.

The following solution is an example of a low throwing power solution used to achieve metal plated terminal areas concentric with pre-drilled holes. For this example a predetermined radius, approximately 0.015 inch greater than the radius of the pre-drilled holes, was selected. Different width areas can be achieved by varying the parameters indicated in this example. It should be obvious that the quantities given throughout this example are approximations and that certain variations may be necessary. A solution of copper fluoborate ($Cu(BF_4)_2$) was mixed in a suitable container with water. The metallic copper equivalent was proportioned in an amount equal to 16 ounces for each gallon of solution prepared. The solution pH was adjusted to be within a range of 0.7–1.0 by adding fluoboric acid to lower the pH or by adding copper carbonate to raise the pH, and was maintained during pattern and hole plating by similar additions. The temperature of the solution was raised to be within the range of 90° to 95° F., and slight agitation of the solution was effected with air or by mechanical means. The proper electrical connections were made to the circuit board and the board was immersed in the solution. The board was plated at a current density of 100 amperes per square foot for two and one half hours. The solution composition and other parameters are pre-set so that the deposited copper forming the terminal area has a maximum and minimum radius. It is possible to vary one or more of the parameters indicated to achieve the same or a different thickness and width of plating. For example, if the temperature is raised to a higher value and the time during which the board is immersed is reduced, current density would have to be increased to achieve the same maximum terminal area radii. If plating is done at higher current densities within the range of 100–125 amperes per square foot, the plating time is reduced a proportionate amount, and the temperature is raised to be within the range of 90° to 170° F. The pH should be higher within the range of 0.5–1.5, and agitation must be increased from slight to moderate.

By way of distinguishment, an example of a high throwing power solution is a copper pyrophosphate solution having the following composition: copper (as metallic equivalent) 2.75 to 3.5 ounces per gallon; pyrophosphate, $P_2O_7$, 20 to 25 ounces per gallon; ammonia, $NH_3$, 0.2 to 0.4 ounce per gallon; water, remainder; $P_2O_7/Cu$ ratio, 7–7.5 to 1; pH, 8.1 to 8.4. Other parameters such as time, temperature, current density, anode/cathode ratios, and agitation are easily determined by those skilled in the art.

Figure 6:
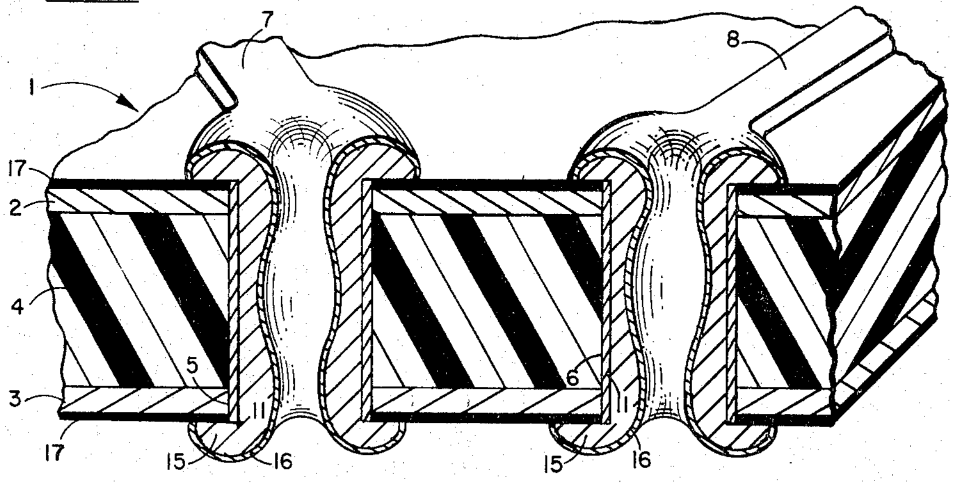
Figure 7:
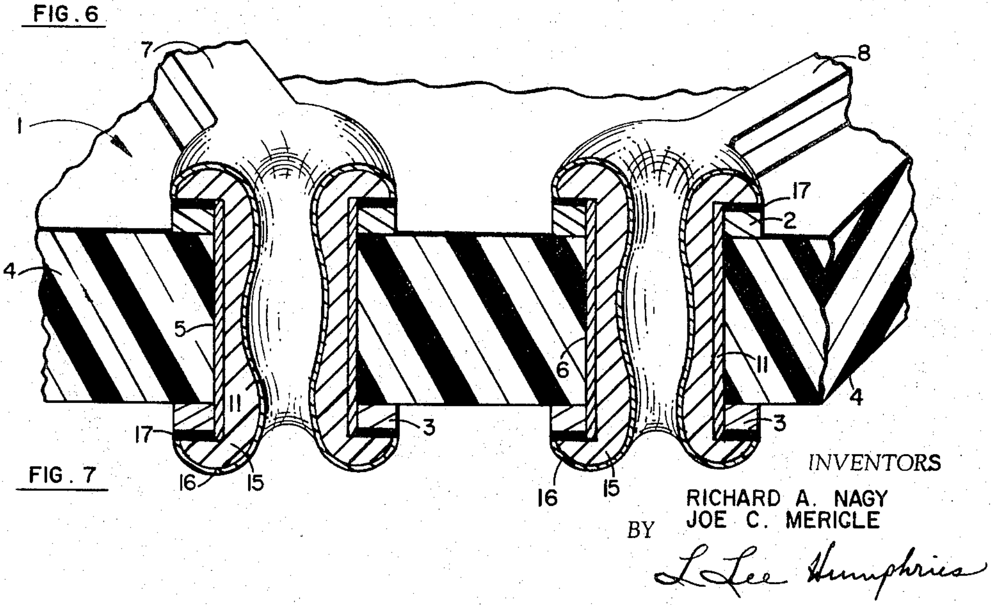

After the terminal areas have been formed and after the conductor pattern has been simultaneously plated with a conducting metal such as copper, the pattern is then plated with gold or some similar metal as shown in FIG. 6, as layer 16. The organic mask or imprinted circuit is removed or stripped away from the board, for example, by dissolution by an appropriate solvent and the board is etched to remove the copper foil exposed after the circuit pattern has been removed. The resulting board appears as shown in FIG. 7 and is ready for use.

The above step-by-step process of forming terminal areas concentric with holes in order to insure an adequate bonding area to effect a complete attachment of an electrical component with the hole area was general in nature. Many steps such as the intermediate cleansing and rinsing operations, the sanding operation to remove the electroless metal film from the board surfaces, the storage of the boards between steps, etc., were not discussed in detail. Such intermediate steps are obvious to a person skilled in the art and do not add to a specific pointing out of the invention of this process.

Although the invention has been described and illustrated in detail, it is to be clearly understood that the same is by way of illustration and example only, and is not to be taken by way of limitation; the spirit and scope of this invention being limited only by the terms of the appended claims.

We claim:

1. A process for manufacturing an electrical pattern on a substrate comprising drilling holes through a metal clad insulative substrate according to a selected pattern, resist printing a circuit pattern on said metal cladding, said circuit pattern defining the circuit lines to be plated and being defined by said resist printing extending to the outer edges of said drilled holes, electroless deposition of a metal film on the inner circumference of said holes, first electroplating with a low throwing power solution said circuit lines to be plated, said inner circumference of said holes having an electrodeposited metal film on the inner circumferences thereof, and the edges of said holes to be plated, thereby forming concentric terminal areas electrically connecting said plated lines and said plated hole inner circumferences, second electroplating on top of said first electroplating, and removing unplated resist printing and unplated metal cladding.

2. The process as defined in claim 1 wherein said low throwing power solution comprises an aqueous solution of copper fluoborate having a pH within the range of 0.5 to 1.5, and a temperature between 90° F. and 170° F., and wherein said first electroplating step utilizes a current density within the range of 100 to 125 amperes per square foot.

3. A process for manufacturing etched circuit boards comprising the steps of drilling holes through a metal clad insulator board according to a selected pattern, resist printing a pattern of conductor lines extending along the top of said metal clad insulator board and along the bottom of said metal clad insulator board between said drilled holes, said pattern of conductor lines defining the circuit lines to be plated and being defined by said resist printing extending to the outer edges of said drilled holes, electroless depositing a first metal film along the inner surface of said drilled holes, first electroplating a first metal layer on the circuit lines to be plated, on the inner surface of said drilled holes, and concentrically about the edges of said drilled holes; said first electroplating step using a low throwing power solution, second electroplating a second metal layer on the first metal layer, removing said resist printing except where covered by said electroplated metal layers, removing said insulator metal cladding from said board except where covered by said electroplated metal layers.

4. The process as defined in claim 3 wherein said low throwing power solution comprises an aqueous solution of copper fluoborate having a proportion of metallic copper in the amount equal to 16 ounces for each gallon of prepared solution, having a pH within the range of 0.7 to 1.0, and having a temperature within the range of 90° F. to 95° F.

5. The process as defined in claim 3 wherein said board is first electroplated at a current density of approximately 100 amperes per square foot for approximately two and one-half hours, and wherein said low throwing power solution comprises an aqueous solution of copper fluoborate.

References Cited

UNITED STATES PATENTS

| | | | |
|---|---|---|---|
| 2,872,391 | 2/1959 | Hauser et al. | 29—155.5 |
| 3,052,957 | 9/1962 | Swanson | 29—155.5 |
| 2,897,409 | 7/1959 | Gitto | 29—155.5 |

OTHER REFERENCES

"Printed Circuit Techniques," National Bureau of Standards Circular 468, p. 24, Nov. 15, 1947.

"Introduction to Printed Circuits" by R. L. Swiggett, p. 35, published by John F. Rider, 1956.

JOHN F. CAMPBELL, *Primary Examiner.*

J. W. BOCK, R. W. CHURCH, *Assistant Examiners.*